(12) United States Patent
Maeda et al.

(10) Patent No.: US 8,581,388 B2
(45) Date of Patent: Nov. 12, 2013

(54) MULTILAYERED WIRING SUBSTRATE

(75) Inventors: Shinnosuke Maeda, Nagoya (JP);
Tetsuo Suzuki, Niwa-gun (JP);
Atsuhiko Sugimoto, Kagamigahara (JP);
Tatsuya Ito, Kagamigahara (JP);
Takuya Hando, Inuyama (JP); Satoshi Hirano, Chita-gun (JP)

(73) Assignee: NGK Spark Plug Co., Ltd, Nagoya (JP)

( * ) Notice: Subject to any disclaimer, the term of this patent is extended or adjusted under 35 U.S.C. 154(b) by 233 days.

(21) Appl. No.: 12/976,427

(22) Filed: Dec. 22, 2010

(65) Prior Publication Data

US 2011/0156272 A1    Jun. 30, 2011

(30) Foreign Application Priority Data

Dec. 28, 2009  (JP) .................. 2009-296912

(51) Int. Cl.
*H01L 23/053* (2006.01)
*H01L 21/4763* (2006.01)

(52) U.S. Cl.
USPC ........... 257/700; 257/758; 257/759; 438/622; 438/623

(58) Field of Classification Search
USPC .................. 438/618, 622, 623; 257/700, 750, 257/758–760, 773, E23.106, E23.107, 257/E23.134, E23.019
See application file for complete search history.

(56) References Cited

U.S. PATENT DOCUMENTS

| | | |
|---|---|---|
| 7,594,317 B2 | 9/2009 | Nakamura |
| 2008/0258300 A1 | 10/2008 | Kobayashi et al. |
| 2011/0139502 A1 | 6/2011 | Kobayashi et al. |
| 2011/0198114 A1* | 8/2011 | Maeda et al. ............ 174/257 |
| 2011/0209910 A1* | 9/2011 | Maeda et al. ............ 174/261 |
| 2011/0211320 A1* | 9/2011 | Maeda et al. ............ 361/782 |
| 2012/0097319 A1* | 4/2012 | Maeda ...................... 156/151 |

FOREIGN PATENT DOCUMENTS

| | | |
|---|---|---|
| JP | 2003-133711 A | 5/2003 |
| JP | 2007158174 | 6/2007 |
| KR | 20080092851 A | 10/2008 |

OTHER PUBLICATIONS

KIPO, Office Action issued in corresponding application 10-2010-0135650, issued Nov. 8, 2012.

* cited by examiner

*Primary Examiner* — Hsien Ming Lee
(74) *Attorney, Agent, or Firm* — Stites & Harbison PLLC; Jeffrey A. Haeberlin; Nicolo Davidson

(57) ABSTRACT

A multilayered wiring substrate, comprising: a plurality of first main surface side connecting terminals arranged in a first main surface of a stack structure; and a plurality of second main surface side connecting terminals being arranged in a second main surface of the stack structure; wherein a plurality of conductor layers are alternately formed in a plurality of stacked resin insulation layers and are operably connected to each other through via conductors tapered such that diameters thereof are widened toward the first or the second main surface, wherein a plurality of openings are formed in an exposed outermost resin insulation layer in the second main surface, and terminal outer surfaces of the second main surface side connecting terminals arranged to match with the plurality of the openings are positioned inwardly from an outer main surface of the exposed outermost resin insulation layer, and edges of terminal inner surfaces are rounded.

15 Claims, 15 Drawing Sheets

MULTILAYERED WIRING SUBSTRATE

CROSS REFERENCE TO RELATED APPLICATION

The present application claims priority from Japanese Patent Application No. 2009-296912, which was filed on Dec. 28, 2009, the disclosure of which is herein incorporated by reference in its entirety.

TECHNICAL FIELD

The present invention relates to a multilayered wiring substrate having a stack structure multilayered by alternately stacking a plurality of resin insulation layers composed of the identical resin insulation material and a plurality of conductor layers and having no so-called core substrate in a final product, the substrate core carrying build-up layers successively formed on opposite surfaces thereof.

BACKGROUND

A semiconductor integrated circuit device (IC chip) used as a microprocessor of a computer or the like has recently become more and more rapid and multifunctional. Accordingly, the number of terminals tends to increase, and a pitch between terminals tends to be narrow. Generally, on the bottom face of the IC chip, a plurality of terminals are densely arranged in an array shape, and such a group of terminals are connected to a group of terminals on the motherboard in a flip-chip shape. However, since the pitch between terminals is significantly different between a group of terminals on the IC chip and a group of terminals on the motherboard, it is difficult to directly connect the IC chip onto the motherboard. Therefore, typically, a method is used in which a semiconductor package is manufactured by mounting the IC chip onto the IC chip mounting wiring substrate, and the semiconductor package is mounted onto the motherboard.

As the IC chip mounting wiring substrate for structuring such a kind of package, a multilayered wiring substrate obtained by forming build-up layers on the front and rear surfaces of the core substrate is used in practice. In the multilayered wiring substrate, for example, a resin substrate (such as a glass epoxy substrate) obtained by impregnating resin with reinforced fiber is used as a core substrate. In addition, build-up layers are formed by alternately stacking resin insulation layers and conductor layers on the front and rear surfaces of the core substrate utilizing the rigidity of the core substrate. That is, in the multilayered wiring substrate, the core substrate has a reinforcing function and is formed to have a significantly larger thickness in comparison with the build-up layer. In addition, the wiring (specifically, a throughhole conductor or the like) for facilitating interconnection between the build-up layers formed on the front and rear surfaces is formed through the core substrate.

On the other hand, as semiconductor integrated circuit devices have recently become faster and faster, the signal frequency used may become a high frequency band. In this case, the wiring passing through the core substrate contributes to a large inductance, which is related to the occurrence of high frequency signal transmission loss or circuit malfunction thus hindering high speed operation. In order to address such problems, it has been proposed to design a multilayered wiring substrate without the core substrate (e.g., refer to Patent Document 1). In this multilayered wiring substrate, the entire wiring length is shortened by omitting the core substrate which has a relatively large thickness. Therefore, it is possible to reduce high frequency signal transmission loss and operate the semiconductor integrated circuit devices at a high speed.

In the manufacturing method disclosed in Patent Document 1, the build-up layer is formed by arranging a metal foil on a single surface of a temporary substrate and alternately stacking a plurality of conductor layers and a plurality of resin insulation layers on the metal foil. Then, the metal foil is separated from the temporary substrate so that a structure having the build-up layer formed on the metal foil is obtained. Subsequently, the outermost layer surface of the build-up layer (the surface of the resin insulation layer or the surface of a plurality of connecting terminals) is exposed by removing the metal foil by etching so that the multilayered wiring substrate is manufactured.

RELATED ART DOCUMENT

Patent Document

Patent Document 1: Japanese Unexamined Patent Application Publication No. 2007-158174-A (FIG. 7).

SUMMARY

However, the aforementioned Patent Document 1 discloses a multilayered wiring substrate in which the surface of the connecting terminal having a relatively large area (such as a motherboard connecting terminal connected to the motherboard) is formed to be parallel with the outermost resin insulation layer without a height difference. In this multilayered wiring substrate, a stress is applied to a boundary portion between the motherboard connecting terminal and the resin insulation layer. Particularly, the stress is concentrated on the edge of the inner surface of the motherboard connecting terminal in some cases. Accordingly, as shown in FIG. 30, a crack 103 may be generated in the resin insulation layer 102 side starting from the edge of the inner surface of the motherboard connecting terminal 101.

Particularly, Patent Document 1 discloses a multilayered wiring substrate in which a solder resist is formed on the outermost layer of the build-up layer. In the multilayered wiring substrate, the stress applied to the boundary portion between the motherboard connecting terminal and the resin insulation layer is alleviated by coating the outer circumferential portion of the surface side of the motherboard connecting terminal. However, in the multilayered wiring substrate, when the solder resist is formed in the outermost layer, since the thermal expansion coefficient differs between the solder resist and each resin insulation layer of the inner layer, the substrate may be warped depending on the difference in the thermal expansion coefficient.

The present invention has been made to address the aforementioned problems, and provides a multilayered wiring substrate with high reliability capable of preventing generation of cracks in the resin insulation layer.

In order to address the aforementioned problems, according to one aspect of the invention, there is provided a multilayered wiring substrate having a stack structure multilayered by alternately stacking a plurality of conductor layers and a plurality of resin insulation layers including an identical resin insulation material, a plurality of first main surface side connecting terminals arranged in a first main surface of the stack structure, a plurality of second main surface side connecting terminals arranged in a second main surface of the stack structure, wherein the plurality of conductor layers are formed in the plurality of resin insulation layers and are operably connected to each other through via conductors tapered such that diameters thereof are widened toward the first main surface or the second main surface, wherein a plurality of openings are formed in an exposed outermost resin insulation layer in the second main surface of the stack structure, and terminal outer surfaces of the second main surface side connecting terminals arranged to match with the plurality of the openings are positioned inwardly from an outer main surface of the exposed outermost resin insulation layer, and edges of terminal inner surfaces are rounded.

Therefore, according to the invention described in the aforementioned means, a multilayered wiring substrate as a coreless wiring substrate that does not include the core substrate is formed by alternately stacking a plurality of conductor layers and a plurality of resin insulation layers including an identical resin insulation material. In this multilayered wiring substrate, a plurality of the second main surface side connecting terminals provided in the second main surface of the stack structure are arranged to match with a plurality of the openings formed in the exposed outermost resin insulation layer. Specifically, since the terminal outer surfaces of the second main surface side connecting terminals are positioned inwardly from the outer main surface of the outermost resin insulation layer, the outermost resin insulation layer has a function of a solder resist, and it is possible to reliably form solder on the terminal outer surfaces of the second main surface side connecting terminals. In addition, since each second main surface side connecting terminal is buried in the inner side of the outermost resin insulation layer, and the edge of each terminal inner surface is rounded, a stress concentration on each edge portion is avoided. Therefore, a risk of generating cracks in the resin insulation layers is reduced, and a reliability of the multilayered wiring substrate is improved in comparison with the related art. When the outer main surface of the exposed outermost resin insulation layer in the second main surface is used as a reference surface, a length extending from the outer main surface to an end portion of the terminal inner surface may be shorter than a length extending from the outer main surface to a center portion of the terminal inner surface. In addition, when the corresponding outer main surface is used as the reference surface, the length extending from the outer main surface to the terminal inner surface may be gradually shortened as running from the center portion of the terminal inner surface to the end portion. In such a structure, a stress concentration on the end portion of the terminal inner surface is avoided. Therefore, a risk of generating cracks in the resin insulation layers is reduced, and the reliability of the multilayered wiring substrate is improved in comparison with the related art.

It is preferable that the terminal outer surfaces of a plurality of second main surface side connecting terminals arranged to match with a plurality of openings have a concave shape, and the deepest portion of the terminal outer surface is positioned inwardly from the inner main surface of the outermost resin insulation layer. If the second main surface side connecting terminal is formed in this manner, since the contact area of the solder for the terminal outer surface increases, it is possible to increase the connection strength of the solder.

A plurality of the second main surface side connecting terminals arranged to match with a plurality of the openings may have a structure in which only an upper surface of a copper layer as a main body is covered by a plating layer made of a material other than copper. In this manner, it is possible to form the solder on the upper surface of the second main surface side connecting terminal with a fine pitch.

The plurality of the second main surface side connecting terminals arranged to match with a plurality of the openings may be for connecting to a motherboard and may correspond to a plurality of motherboard connecting terminals, each having an area larger than that of each first main surface side connecting terminal. In this case, it is possible to reliably connect the plurality of the second main surface side connecting terminals, each having a relatively large area, to a motherboard. In addition, the plurality of second main surface side connecting terminals may be provided in the second main surface to be connected to the motherboard, or, in the opposite side, for example, in the first main surface where the IC chip is mounted.

It is preferable that the thickness extending from the outer main surface of the exposed outermost resin insulation layer with respect to the second main surface of the stack structure to the nearest conductor layer is larger than the thickness of the other resin insulation layers in the stack structure. In this manner, it is possible to reliably form the second main surface side connecting terminal such that the terminal outer surface is positioned inwardly from the outer main surface of the outermost resin insulation layer, alleviate the stress, and suppress cracks as shown in FIG. 30.

All of the via conductors formed in the plurality of resin insulation layers may be tapered such that the diameters thereof are widened as running from the second main surface to the first main surface. Inversely, all of the via conductors formed in the plurality of resin insulation layers may be tapered such that the diameters thereof are widened as running from the first main surface side to the second main surface side. In this manner, it is possible to relatively easily manufacture the coreless wiring substrate that does not have a core substrate.

It is preferable that a plurality of resin insulation layers are formed using the identical build-up material including a cured material of a resin insulation material that does not yield photo-curability, such as a thermosetting resin insulation material. In this case, since the outermost resin insulation layer having each connecting terminal is made of the same build-up material as that of the inner resin insulation layers having an excellent insulation property, it is possible to reduce the interval between each connecting terminal and obtain high integration of the multilayered wiring substrate.

Preferable examples of the material of the resin insulation layer include thermosetting resin such as epoxy resin, phenol resin, urethane resin, silicon resin, and polyimide resin, or thermoplastic resin such as polycarbonate resin, acrylic resin, polyacetyl resin, and polypropylene resin, and the like. In addition, a composite material of such resin and organic fiber such as glass fiber (glass woven fabrics or glass non-woven fabrics) or polyamide fiber, or a resin-resin composite material obtained by impregnating thermosetting resin such as epoxy resin in a fluorine-based resin material having a 3-dimensional mesh shape such as a continuous porous PTFE may be used.

The conductor layer is mainly made of copper and is formed using a technique known in the art such as a subtractive method, a semi-additive method, or a full-additive method. Specifically, techniques such as etching of copper foils or the like, electroless copper plating, or electro copper plating are applied. In addition, the conductor layer or the connecting terminal may be formed by performing etching after forming the thin film using sputtering, CVD, or the like. The conductor layer or the connecting terminal may be formed using printing of a conductive paste or the like.

According to another aspect of the invention, there is provided a method of manufacturing a multilayered wiring substrate, the method including: a process of forming a metal conductor portion, including preparing a support base material made by stacking metal foils on a single surface in a removable state and forming a metal conductor portion to be used as the second main surface side connecting terminal later on the metal foil; a rounding process for rounding the edge of the metal conductor portion after the process of forming the metal conductor portion; a build-up process for forming a stack structure multilayered by alternately stacking a plurality of resin insulation layers and a plurality of conductor layers after the rounding process; a process of removing the base material, in which the metal foil is exposed by removing the support base material after the build-up process; and a process of forming the connecting terminals, in which the second main surface side connecting terminals are formed by etching and removing the metal foil in the stack structure except for a part of the metal conductor portion after the build-up process. If the multilayered wiring substrate is manufactured in this manner, it is possible to position the terminal outer surface of the second main surface side connecting terminal inwardly from the outer main surface of the outermost resin insulation layer. In addition, the edge of the terminal inner surface of the second main surface side connecting terminal can be rounded. If the second main surface side connecting terminal is formed in this manner, it is possible to reduce the risk of generating cracks in the resin insulation layer, and manufacture a reliable multilayered wiring substrate in comparison with the related art. In addition, since the inner conductor layer of the stack structure is stacked after the metal conductor portion corresponding to the second main surface side connecting terminal is patterned, it is possible to prevent a positional deviation between the second main surface side connecting terminal and the inner conductor layer. Furthermore, since it is unnecessary to form a pattern of the second main surface side connecting terminal after the process of removing the base material, it is possible to relatively easily manufacture the multilayered wiring substrate.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE PRESENT INVENTION

First Embodiment

Figure 1:
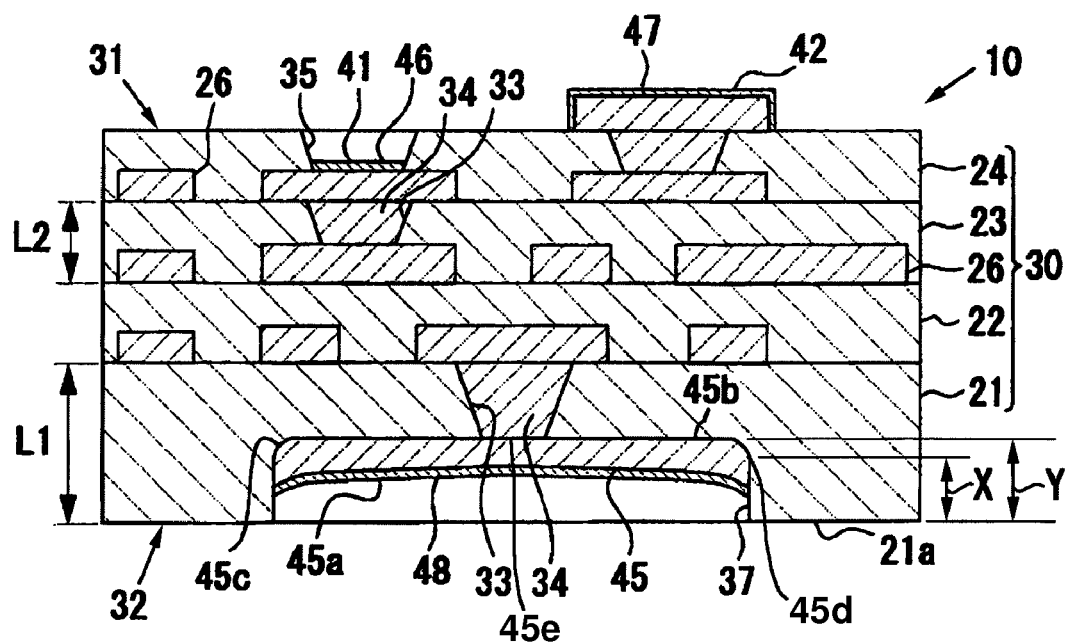
FIG. 1 is a cross-sectional view illustrating a schematic configuration of a multilayered wiring substrate according to the first embodiment.

Hereinafter, a multilayered wiring substrate according to the first embodiment of the present invention will be described in detail with reference to the accompanying drawings. FIG. 1 is an enlarged cross-sectional view illustrating a schematic configuration of the multilayered wiring substrate according to the present embodiment. In addition, FIG. 2 is a plan view illustrating the multilayered wiring substrate viewed from the upper surface side, and FIG. 3 is a plan view illustrating the multilayered wiring substrate viewed from the bottom surface side.

Referring to FIG. 1, the multilayered wiring substrate 10 is a coreless wiring substrate which does not have the core substrate but has a wiring stack portion 30 (stack structure) multilayered by alternately stacking four resin insulation layers 21 to 24 including the identical resin insulation material, and a conductor layer 26 made of copper. Each resin insulation layer 21 to 24 is formed using a build-up material including a resin insulation material that does not yield photocurability, specifically, a cured material of thermosetting epoxy resin. In the multilayered wiring substrate 10, a plurality of connecting terminals 41 and 42 (first main surface side connecting terminals) are arranged on the upper surface 31 (first main surface) side of the wiring stack portion 30.

Figure 2:
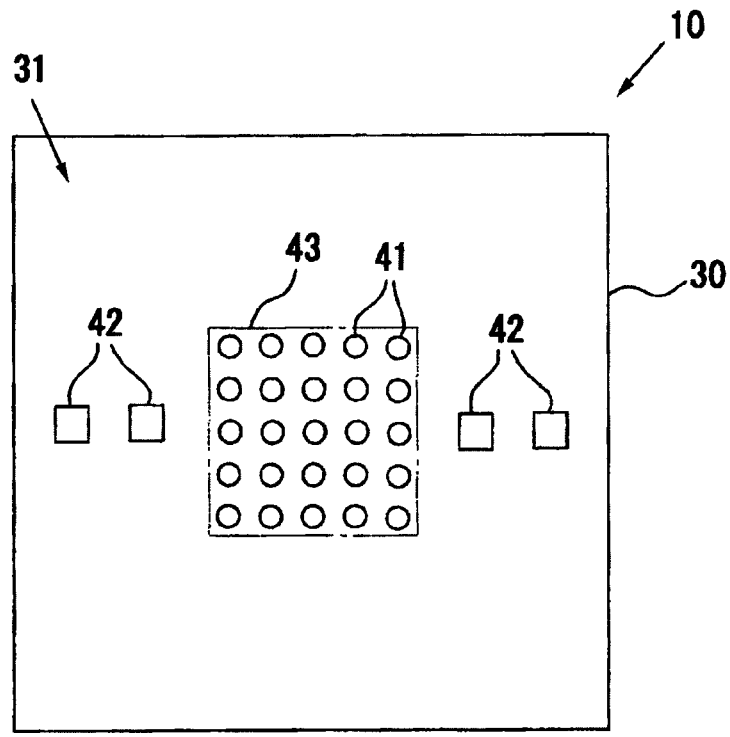
FIG. 2 is a plan view illustrating a schematic configuration of the multilayered wiring substrate.

As shown in FIGS. 1 and 2, in the multilayered wiring substrate 10 of the present embodiment, as a plurality of connecting terminals 41 and 42 arranged in the upper surface 31 side of the wiring stack portion 30, there are an IC chip connecting terminal 41 to be connected to the IC chip and a condenser connecting terminal 42 to be connected to the chip condenser. In the upper surface 31 side of the wiring stack portion 30, a plurality of IC chip connecting terminals 41 are arranged in an array shape in the chip mounting area 43 provided in the substrate center portion. In addition, the condenser connecting terminal 42 has a larger area than that of the IC chip connecting terminal 41 and is arranged in the outer circumference side from the chip mounting area 43.

Figure 3:
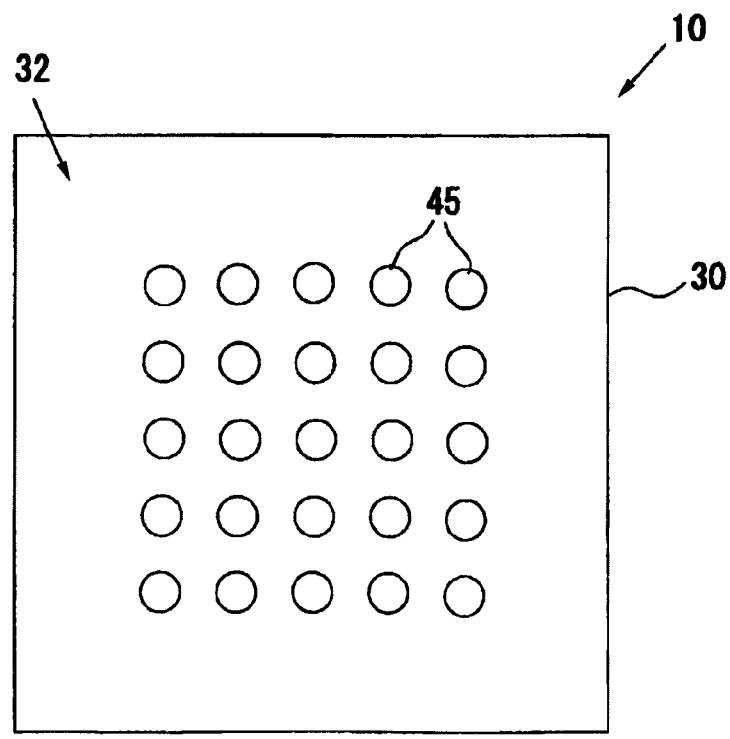
FIG. 3 is a plan view illustrating a schematic configuration of the multilayered wiring substrate.

On the other hand, as shown in FIGS. 1 and 3, in the lower surface 32 (second main surface) side of the wiring stack portion 30, a plurality of connecting terminals 45 (motherboard connecting terminals as the second surface side connecting terminal) used for a land grid area (LGA) to be connected to the motherboard are arranged in an array shape. The motherboard connecting terminal 45 has a larger area than those of the condenser connecting terminal 42 and the IC chip connecting terminal 41 provided in the upper surface 31 side.

Each of the resin insulation layers 21 to 24 is provided with a via hole 33 and a filled via conductor 34. All of the via conductors 34 have a tapered shape in the same direction (in FIG. 1, a diameter is widened from the lower surface side to the upper surface side), and electrically connect each conductor layer 26, the IC chip connecting terminal 41, the condenser connecting terminal 42, and the motherboard connecting terminal 45 to each other.

In the upper surface 31 side of the wiring stack portion 30, the fourth resin insulation layer 24 is provided with an opening 35. In addition, the IC chip connecting terminal 41 is formed within the opening 35 while the height of the top surface of IC chip connecting terminal 41 is lower than the height of the surface (reference surface) of the resin insulation layer 24. In addition, the IC chip connecting terminal 41 has a structure in which only the upper surface of the copper layer as a main body of the IC chip connecting terminal 41 is covered by a plating layer 46 other than copper (specifically, nickel-gold plating layer). That is, the IC chip is connected to the upper surface of the exposed IC chip connecting terminal 41 through a bump (not shown) in a flip-chip manner.

The condenser connecting terminal 42 is made of a copper layer as a main body and is formed such that the height of the upper surface is higher than the height of the surface of the resin insulation layer 24. That is, in the multilayered wiring substrate 10 of the present embodiment, the height differs between the upper surface of the IC chip wiring terminal 41 and the upper surface of the condenser connecting terminal 42 such that the height of the upper surface of the condenser connecting terminal 42 having a relatively large area is higher than the height of the upper surface of the IC chip connecting terminal 41 having a relatively small area. In addition, the upper and side surfaces of the copper layer as a main body of the condenser connecting terminal 42 are covered by a plating layer 47 other than copper (specifically, nickel-gold plating layer). The external terminal of the chip condenser is connected to the condenser connecting terminal 42 through solder (not shown).

In the lower surface 32 side of the wiring stack portion 30, a plurality of openings 37 are formed in the exposed outermost resin insulation layer 21, and at the same time, the motherboard connecting terminals 45 are arranged to match with a plurality of the openings 37. Specifically, the motherboard connecting terminal 45 is made of a copper layer as a main body, and the terminal outer surface 45a is disposed inwardly from the surface 21a (outer main surface) of the outermost resin insulation layer 21. In addition, in the motherboard connecting terminal 45, the terminal outer surface 45a has a concave shape, and the edge 45c of the terminal inner surface 45b is rounded. Here, using the surface 21a (outer main surface) of the outermost resin insulation layer 21 as a reference surface, the length X extending from the surface 21a thereof to the end portion 45d of the terminal inner surface 45b is shorter than the length Y extending from the surface 21a to the center portion 45e of the terminal inner surface 45b. In addition, it can be recognized that the length extending from the surface 21a to the terminal inner surface 45b is gradually shortened as running from the center portion 45e of the terminal inner surface 45b to the end portion 45d. In the present embodiment, the terminal outer surface 45a of the motherboard connecting terminal 45 is curved in a bowl shape in which the inclination angle in the terminal outer circumference side is larger, and the terminal center becomes the deepest portion. In addition, the motherboard connecting terminal 45 has a structure in which only the outer surface of the copper layer as a main body is covered by a plating layer 48 (specifically, nickel-gold plating layer) other than copper. Furthermore, the motherboard is connected to the motherboard connecting terminal 45 through solder (not shown).

In addition, in the lower surface 32 side of the wiring stack portion 30, the thickness L1 (in the present embodiment, the thickness of the resin insulation layer 21) extending from the outer main surface 21a of the exposed outermost resin insulation layer 21 to the nearest conductor layer 26 is larger than each thickness L2 of the other resin insulation layers 22 to 24 in the wiring stack portion 30. In the multilayered wiring substrate 10 of the present embodiment, the motherboard connecting terminal 45 is positioned in the inner side of the opening 37 by thickly forming the outermost resin insulation layer 21.

The multilayered wiring substrate 10 having the aforementioned structure is manufactured, for example, through the following sequence.

First, in a build-up process, a support substrate having sufficient strength (such as a glass epoxy substrate) is prepared, and a wiring stack portion 30 is formed by building up the resin insulation layers 21 to 24 and the conductor layer 26 on the support substrate.

Figure 4:
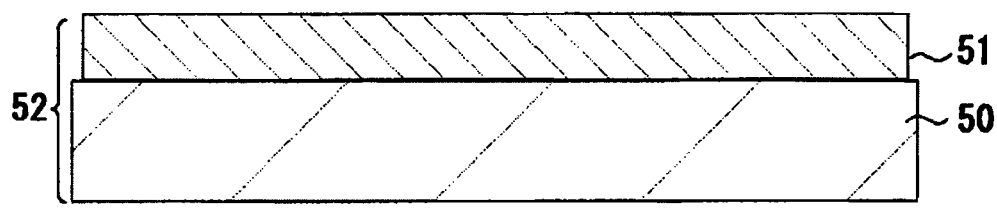
FIG. 4 is an explanatory diagram illustrating a method of manufacturing the multilayered wiring substrate.
Figure 5:
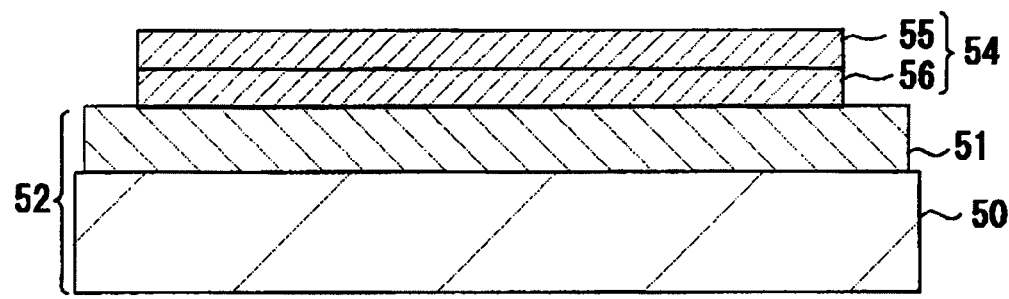
FIG. 5 is an explanatory diagram illustrating a method of manufacturing the multilayered wiring substrate.

Specifically, as shown in FIG. 4, a base material 52 including the support substrate 50 and the underlying resin insulation layer 51 is obtained by forming the underlying resin insulation layer 51 by adhering an insulation resin base material having a sheet shape and made of epoxy resin on the support substrate 50. As shown in FIG. 5, a stack metal sheet body 54 is arranged on a single surface of the base material 52 (specifically, the upper surface of the underlying resin insulation layer 51). Here, adherence is reliably obtained such that the stack metal sheet body 54 is not separated from the underlying resin insulation layer 51 in the subsequent manufacturing process by arranging the stack metal sheet body 54 on the underlying resin insulation layer 51. The stack metal sheet body 54 includes two copper foils 55 and 56 (a pair of metal foils) in a removable state. Specifically, the stack metal sheet body 54 is formed by arranging the copper foils 55 and 56 using the metal plating (such as chrome plating, nickel plating, titanium plating, or a combination of them).

Figure 6:
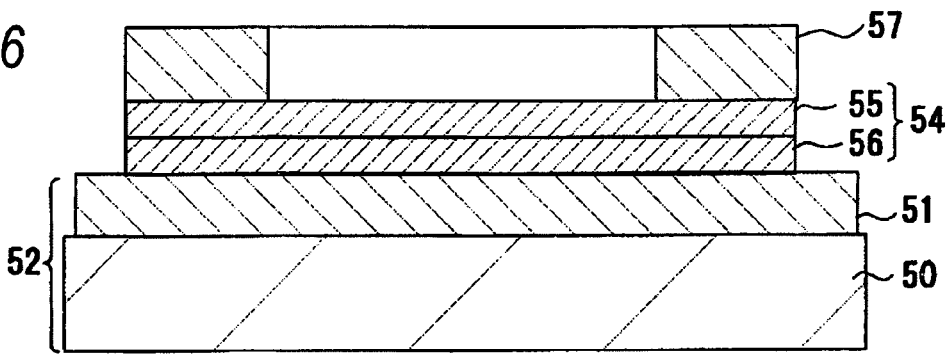
FIG. 6 is an explanatory diagram illustrating a method of manufacturing the multilayered wiring substrate.
Figure 7:
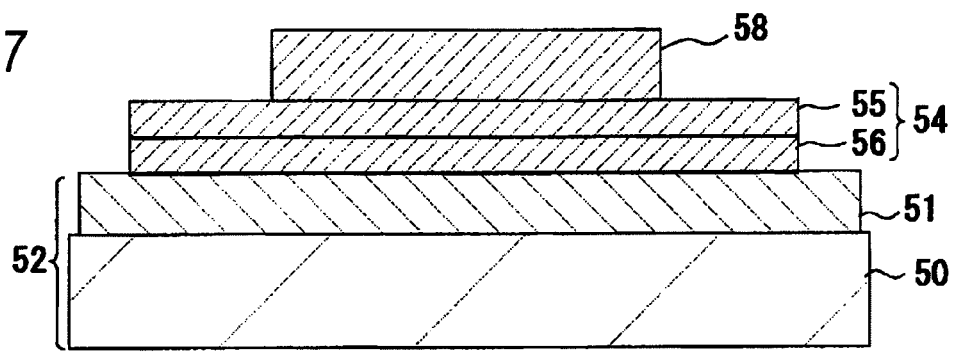
FIG. 7 is an explanatory diagram illustrating a method of manufacturing the multilayered wiring substrate.

Then, the metal conductor portion to be used as the motherboard connecting terminal 45 is formed on the stack metal sheet body 54 (a process of forming the metal conductor portion). Specifically, as shown in FIG. 6, a dry film for forming the plating resist is laminated on the upper surface of the stack metal sheet body 54, and the dry film is exposed and developed. As a result, a plating resist 57 having a predetermined pattern having openings in the portions corresponding to the motherboard connecting terminal 45 is formed. In addition, electro copper plating is selectively performed while the plating resist 57 is formed, the metal conductor portion 58 is formed on the stack metal sheet body 54, and then, the plating resist 57 is exfoliated (refer to FIG. 7).

Figure 8:
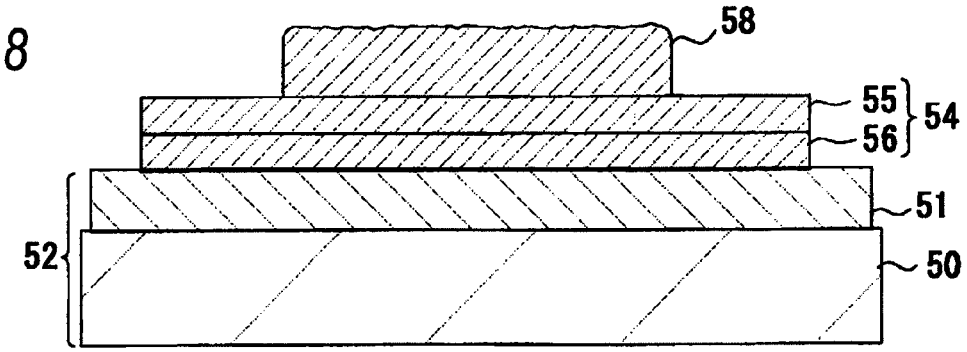
FIG. 8 is an explanatory diagram illustrating a method of manufacturing the multilayered wiring substrate.

After the process of forming the metal conductor portion, the surface of the metal conductor portion 58 is roughened (CZ treatment) in order to increase adherence with the resin insulation layer (refer to FIG. 8). In this case, while the surface of the metal conductor portion 58 is roughened, the edge of the metal conductor portion 58 is rounded at the same time (rounding process).

Figure 9:
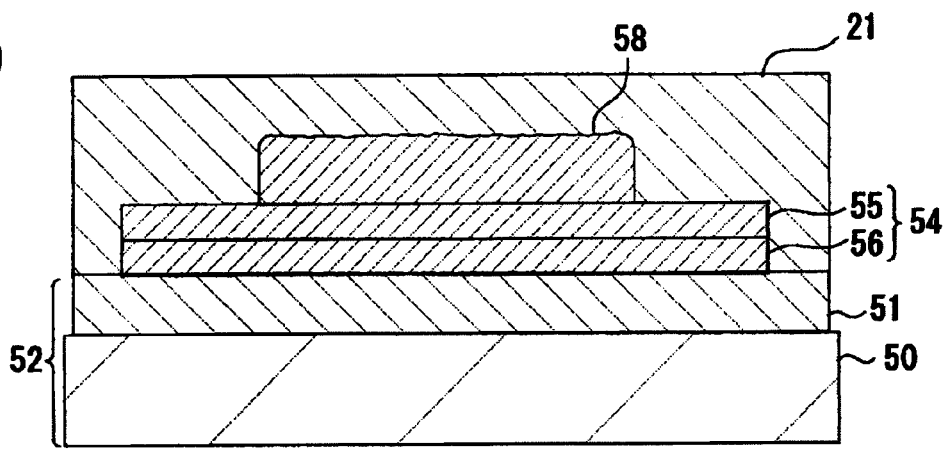
FIG. 9 is an explanatory diagram illustrating a method of manufacturing the multilayered wiring substrate.

Then, the resin insulation layer 21 having a sheet shape is arranged to envelop the stack metal sheet body 54 having the metal conductor layer 58, and the resin insulation layer 21 is adhered (refer to FIG. 9). Here, the resin insulation layer 21 abuts on the stack metal sheet body 54 and the metal conductor portion 58, and at the same time, abuts on the underlying resin insulation layer 51 in the circumference area of the stack metal sheet body 54, so as to seal the stack metal sheet body 54.

Figure 10:
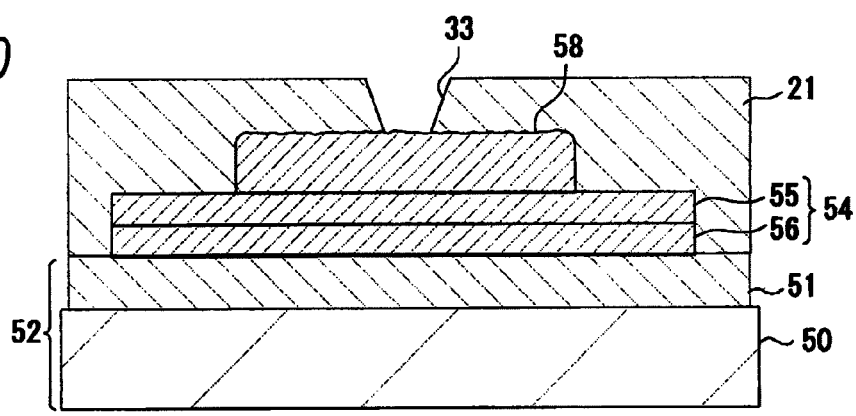
FIG. 10 is an explanatory diagram illustrating a method of manufacturing the multilayered wiring substrate.

In addition, as shown in FIG. 10, a via hole 33 is formed in a predetermined position (in the position over the metal conductor portion 58) of the resin insulation layer 21 by performing a laser process, for example, using excimer laser, UV laser, $CO_2$ laser or the like. Then, a de-smear process for removing the smear within each via hole 33 is performed using an etching solution such as a potassium permanganate solution. In addition, as a de-smear process, a plasma ashing process, for example, using $O_2$ may be performed in addition to the process using the etching solution.

Figure 11:
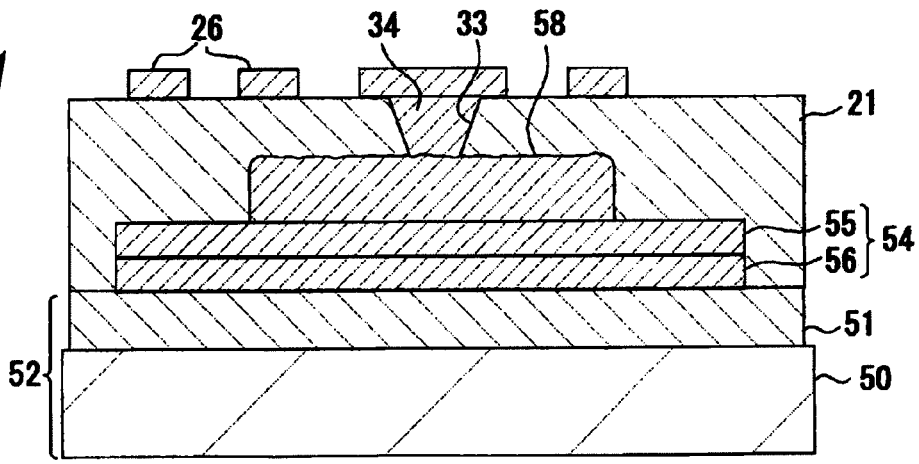
FIG. 11 is an explanatory diagram illustrating a method of manufacturing the multilayered wiring substrate.

After the de-smear process, a via conductor 34 is formed within each via hole 33 by performing electroless copper plating and electro copper plating according to a technique known in the related art. In addition, a pattern of the conductor layer 26 is formed on the resin insulation layer 21 by performing etching using a technique known in the related art, such as a semi-additive method (refer to FIG. 11).

In addition, the second to fourth resin insulation layers 22 to 24 and the conductor layer 26 may be formed using a method similar to those of the aforementioned first resin insulation layer 21 and the conductor layer 26 and stacked on the resin insulation layer 21. Therefore, a plurality of openings 35 are formed by performing a laser boring process for the outermost resin insulation layer 24 (refer to FIG. 12). Next, a de-smear process for removing the smear within each opening 35 is performed using a potassium permanganate solution, $O_2$ plasma, or the like.

Figure 12:
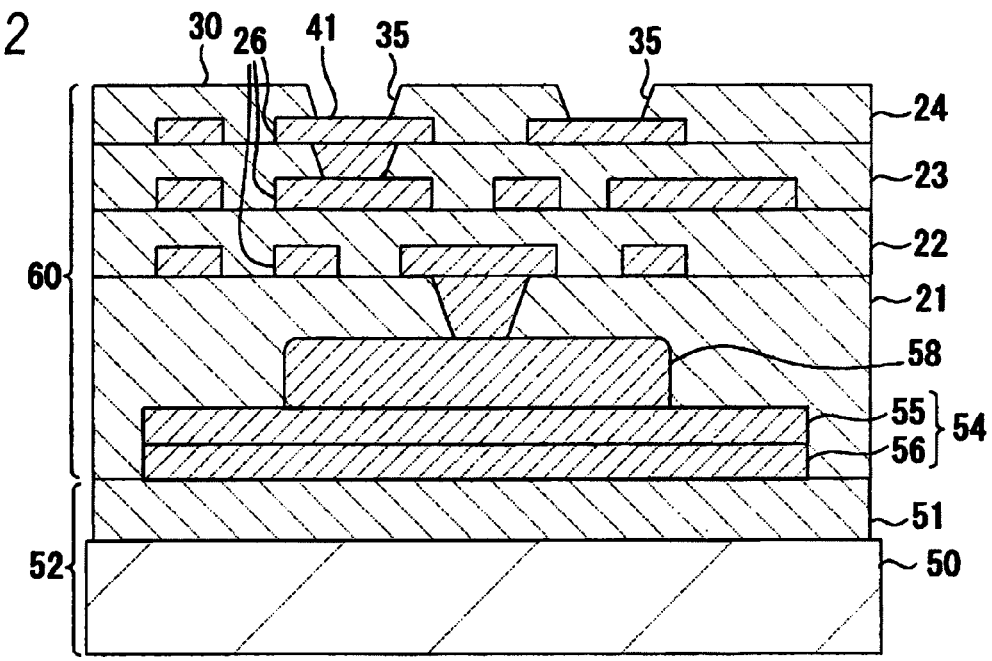
FIG. 12 is an explanatory diagram illustrating a method of manufacturing the multilayered wiring substrate.

Through the aforementioned build-up process, the wiring stack body 60 is formed by stacking the stack metal sheet body 54, the resin insulation layers 21 to 24, and the conductor layer 26 on the base material 52. In addition, as shown in FIG. 12, the area positioned over the stack metal sheet body 54 in the wiring stack body 60 corresponds to the wiring stack portion 30 of the multilayered wiring substrate 10. Furthermore, a part of the conductor layer 26 exposed by the opening 35 in the wiring stack body 60 corresponds to the IC chip connecting terminal 41.

Then, the entire surface plating layer which covers each resin insulation layers 21 to 24 and the inner side of the opening 35 of the resin insulation layer 24 is formed by performing electroless copper plating (entire surface plating process). In this case, the copper plating is also formed in the inner surface of the opening 35.

In addition, a dry film for forming the plating resist is laminated on the upper surface of the wiring stack body 60, and a plating resist having a pattern opened in the portion corresponding to the condenser connecting terminal 42 is formed by exposing and developing the dry film. Then, the filled via conductor is formed in the inner side of a part of a plurality of openings 35, and at the same time, the condenser connecting terminal 42 is formed in the upper side of the filled via conductor by selectively performing pattern plating while the plating resist is formed (a process of forming the filled via conductor).

Figure 13:
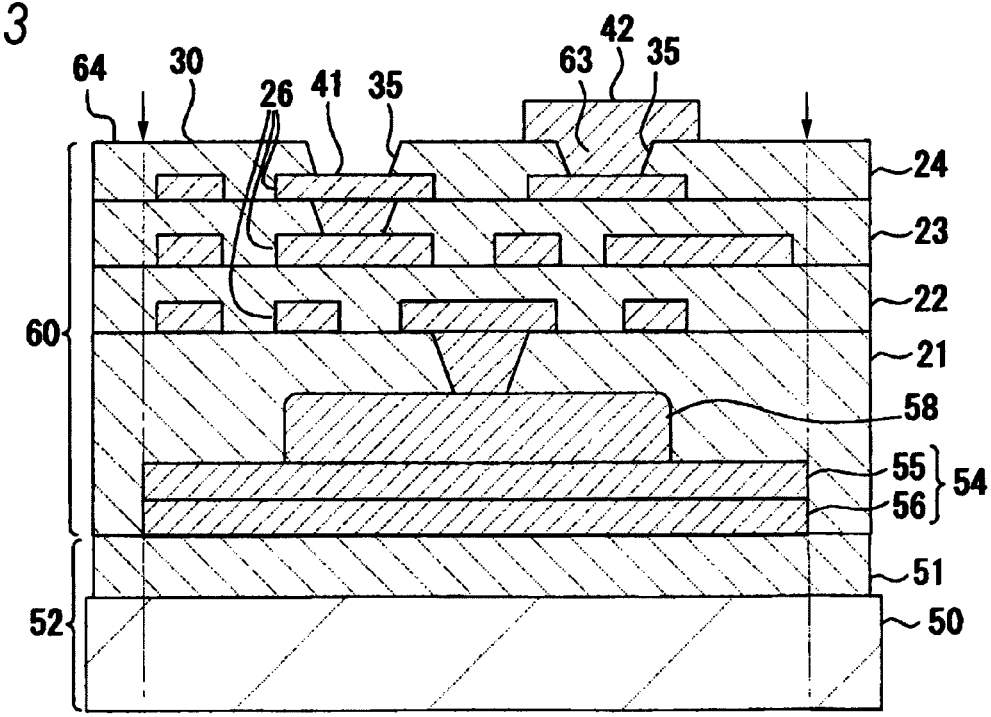
FIG. 13 is an explanatory diagram illustrating a method of manufacturing the multilayered wiring substrate.

After the process of forming the filled via conductor, as shown in FIG. 13, the entire surface plating layer is removed except for the filled via conductor 63 and the condenser connecting terminal 42 by performing pattering using a semi-additive method (a process of removing the entire surface plating layer).

After the process of removing the entire surface plating layer, the wiring stack body 60 is cut using a dicing apparatus (not shown), and the circumference area of the wiring stack portion 30 is removed (cutting process). Then, as shown in FIG. 13, in the boundary between the wiring stack portion 30 and the circumference portion 64 (the boundary shown as an arrow in FIG. 13), the cutting is performed for the base material 52 provided under the wiring stack portion 30 (including the support substrate 50 and the underlying resin insulation layer 51). As a result of the cutting, the outer edge portion of the stack metal sheet body 54 sealed by the resin insulation layer 21 is exposed. That is, by removing the circumference portion 64, the adhering portion between the underlying resin insulation layer 51 and the resin insulation layer 21 is removed. As a result, the wiring stack portion 30 and the base material 52 are connected only through the stack metal sheet body 54.

Figure 14:
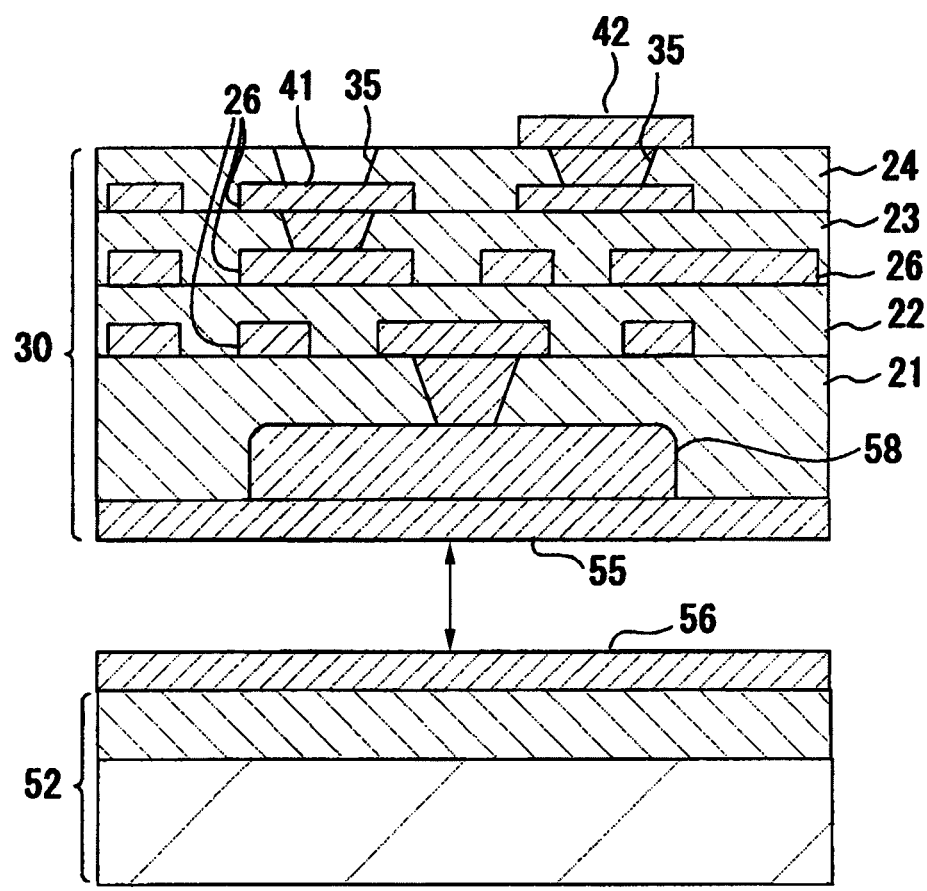
FIG. 14 is an explanatory diagram illustrating a method of manufacturing the multilayered wiring substrate.

Here, as shown in FIG. 14, the base material 52 is removed from the wiring stack portion 30 by exfoliating the boundary of a pair of the copper foils 55 and 56 of the stack metal sheet body 54 to expose the copper foil 55 provided in the lower surface of the wiring stack portion 30 (the resin insulation layer 21) (a process of removing the base material).

Figure 15:
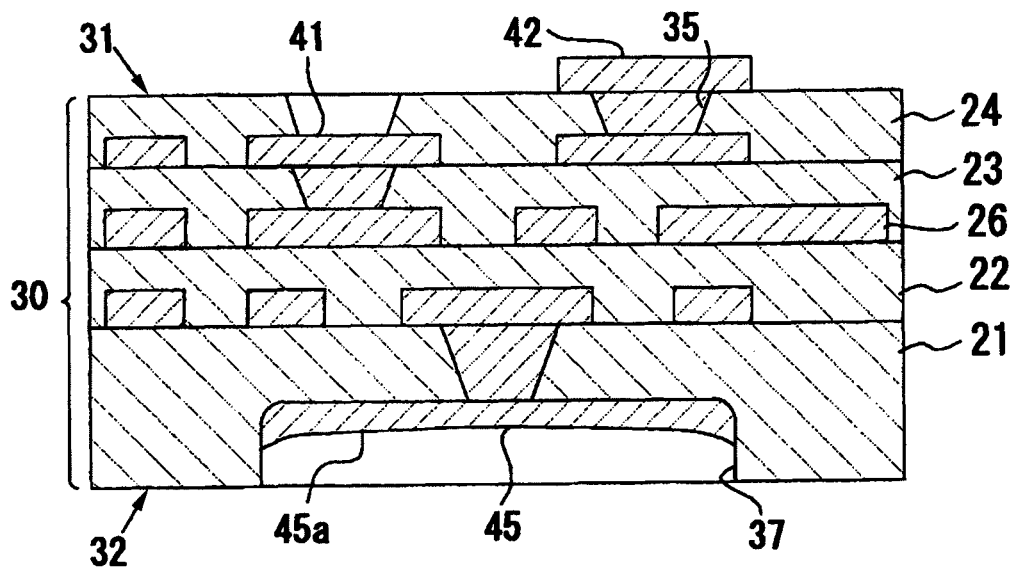
FIG. 15 is an explanatory diagram illustrating a method of manufacturing the multilayered wiring substrate.

Then, the motherboard connecting terminal 45 is formed by etching and removing the copper foil 55 except for a part of the metal conductor portion 58 in the lower surface 32 side of the wiring stack portion 30 (a process of forming the connecting terminal). Specifically, a dry film for forming the etching resist is laminated on the upper surface 31 of the wiring stack portion 30, and the etching resist which covers the entire upper surface 31 is formed by exposing and developing the dry film. In this state, the copper foil 55 is entirely removed by etching the wiring stack portion 30, and a part of the lower side of the metal conductor portion 58 is removed at the same time. As a result, the opening 37 is formed in the resin insulation layer 24, and the metal conductor portion 58 remaining in the opening 37 becomes the motherboard connecting terminal 45 (refer to FIG. 15). In addition, here, since the center of the metal conductor portion 58 is more efficiently etched and removed in comparison with the end portion side of the metal conductor portion 58, the terminal outer surface 45a of the motherboard connecting terminal 45 is made to have a concave shape. In addition, a degree of forming the concave shape in the terminal outer surface 45a is adjusted by changing etching conditions such as a concentration of the etching solution, a temperature, and a processing time.

Then, electroless nickel plating and electroless gold plating are sequentially performed for the surface of the IC chip connecting terminal 41, the surface of the condenser connecting terminal 42, and the surface of the motherboard connecting terminal 45 so that the nickel-gold plating layers 46, 47, and 48 are formed (a plating process). Through the aforementioned processes, the multilayered wiring substrate 10 of FIG. 1 is manufactured.

Therefore, according to the present embodiment, the following effects can be obtained.

(1) In the multilayered wiring substrate 10 according to the present embodiment, the motherboard connecting terminal 45 is provided within a plurality of openings 37 formed in the resin insulation layer 21 of the exposed outermost layer in the lower surface 32 side of the wiring stack portion 30. The terminal outer side 45a of the motherboard connecting terminal 45 is positioned inwardly from the outer main surface 21a of the outermost resin insulation layer 21. In this case, the outermost resin insulation layer 21 has a function of the solder resist, and solder can be reliably formed on the terminal outer surface 45a of the motherboard connecting terminal 45. In addition, while the motherboard connecting terminal 45 is buried in the inner side of the outermost resin insulation layer 21, the edge 45c of the terminal inner side 45b is rounded so that stress concentration on the edge portion is avoided. Therefore, a risk of generating cracks in the resin insulation layer 21 is reduced, and reliability of the multilayered wiring substrate 10 is improved in comparison with the related art.

(2) In the multilayered wiring substrate 10 according to the present embodiment, the terminal outer surface 45a of the motherboard connecting terminal 45 is formed in a concave shape. Therefore, the contact area of the solder formed on the terminal outer surface 45a increases, and it is possible to increase the connecting strength of the solder.

(3) In the multilayered wiring substrate 10 according to the present embodiment, the motherboard connecting terminal 45 has a structure that only the terminal outer surface 45a is covered by the plating layer 48. Therefore, it is possible to reliably form the solder on the terminal outer surface 45a.

(4) In the multilayered wiring substrate 10 according to the present embodiment, in the lower surface 32 side of the wiring stack portion 30, the thickness L1 from the outer main surface 21a of the exposed outermost resin insulation layer 21 to the nearest conductor 26 is larger than each thickness L2 of the other resin insulation layers 22 to 24 of the wiring stack portion 30. As a result, it is possible to reliably form the motherboard connecting terminal 45 such that the terminal outer surface 45a is positioned inwardly from the outer main surface 21a of the resin insulation layer 21.

(5) According to the present embodiment, the metal conductor portion 58 corresponding to the motherboard connecting terminal 45 is patterned first, and then, the inner conductor layer 26 of the wiring stack portion 30 is stacked. Therefore, it is possible to prevent a positional deviation between the motherboard connecting terminal 45 and the inner conductor layer 26. Furthermore, since it is not necessary to perform patterning of the motherboard connecting terminal 45 after the process of removing the base material, it is possible to relatively easily manufacture the multilayered wiring substrate 10.

(6) In the multilayered wiring substrate 10 according to the present embodiment, a plurality of connecting terminals 41 and 42 formed in the upper surface 31 side of the wiring stack portion 30 have different upper surface heights for each type of the connecting target. Specifically, as a plurality of connecting terminals 41 and 42, there are an IC chip connecting terminal 41 to be connected to the IC chip and a condenser connecting terminal 42 to be connected to the chip condenser. In addition, the IC chip connecting terminal 41 is lower than the surface of the outermost exposed resin insulation layer 24, and the condenser connecting terminal 42 is higher than the surface of the resin insulation layer 24. As a result, it is possible to reliably form a solder bump for connecting the IC chip on the IC chip connecting terminal 41 with a fine pitch in a flip-chip manner and reliably connect the IC chip. In addition, it is possible to reliably form the solder for connecting the chip condenser in the condenser connecting terminal 42 and reliably connect the chip condenser.

(7) In the multilayered wiring substrate 10 according to the present embodiment, the opening 35 is formed in the resin insulation layer 24 exposed in the upper surface 31 side of the wiring stack portion 30, and at the same time, the IC chip connecting terminal 41 is formed within the opening 35 while the height of the upper surface is lower than the surface of the resin insulation layer 24. As a result, it is possible to easily position the solder balls within the opening 35 on the IC chip connecting terminal 41, and more reliably form the solder bump on the IC chip connecting terminal 41.

(8) In the multilayered wiring substrate 10 according to the present embodiment, since the condenser connecting terminal 42 has a structure that the upper surface and the side surface thereof are covered by the plating layer 47, it is possible to attach the solder to the upper surface and the side surface. Therefore, it is possible to reliably form the solder fillet having a relatively preferable shape to connect components. In addition, since the IC chip connecting terminal 41 has a structure that the upper surface thereof is covered by the plating layer 46, it is possible to reliably form the solder bump on the upper surface of the IC chip connecting terminal 41. Here, since the interval of the condenser connecting terminal 42 is wider than the interval of the IC chip connecting terminal 41, and the size of the condenser connecting terminal 42 is relatively large, it is possible to reliably solder and connect the chip condenser using the solder formed in the upper surface and side surface of the condenser connecting terminal 42 with sufficient strength. On the other hand, since the interval of the IC chip connecting terminal 41 is narrow, if the solder bump is inflated in the transverse direction of the IC chip connecting terminal 41 (in a direction parallel to the substrate), an electrical short between terminals becomes problematic. On the contrary, according to the present embodiment, since the solder bump is formed only in the upper surface of the IC chip connecting terminal 41, the solder bump is not inflated in the transverse direction. Therefore, it is possible to avoid an electrical short between the terminals through the solder bump.

(9) In the multilayered wiring substrate 10 according to the present embodiment, a plurality of resin insulation layers 21 to 24 are formed using the identical build-up material including a cured material of a resin insulation material that does not yield a photo-curability. That is, the outermost resin insulation layer 24 is formed of a build-up material having the same excellent insulation property as those of the inner resin insulation layers 22 and 23. Therefore, it is possible to narrow the interval between terminals of the IC chip connecting terminal 41 and the condenser connecting terminal 42 and obtain high integration of the multilayered wiring substrate 10. In addition, in the multilayered wiring substrate 10, since a solder resist is not formed in the outermost layer, it is possible to avoid warping of the multilayered wiring substrate 10 generated by a difference of the thermal expansion coefficient between the resin insulation layers 21 to 24 and a solder resist.

Second Embodiment

Figure 16:
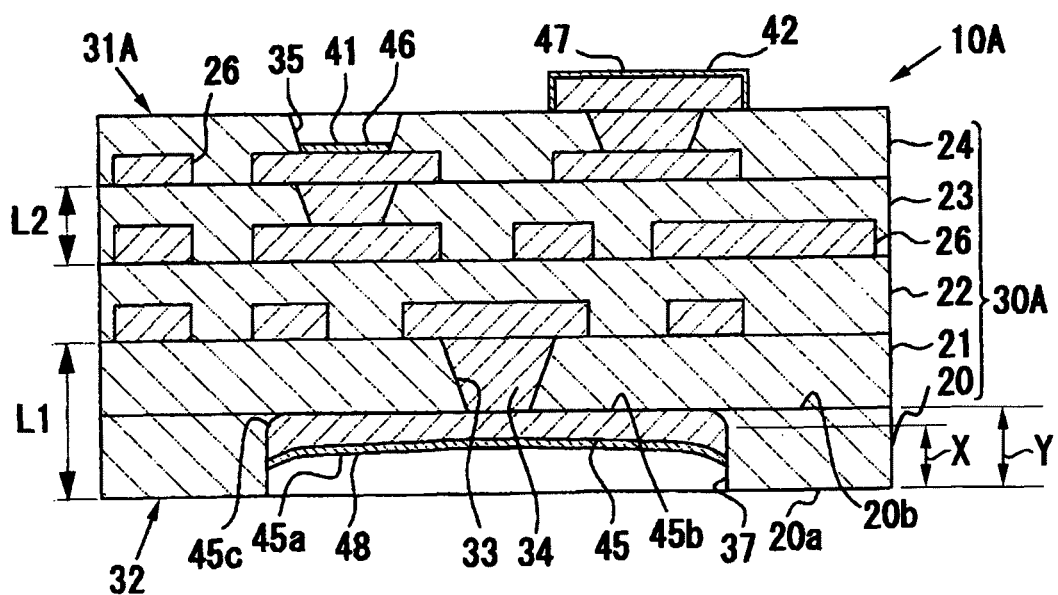
FIG. 16 is a cross-sectional view illustrating a schematic configuration of the multilayered wiring substrate according to the second embodiment.

Next, a second embodiment according the present invention will be described with reference to the accompanying drawings. FIG. 16 is an enlarged cross-sectional view illustrating a schematic configuration of the multilayered wiring substrate 10A according to the present embodiment. In the aforementioned multilayered wiring substrate 10 according to the first embodiment, the motherboard connecting terminal 45 and the via conductor 34 connected to the motherboard connecting terminal 45 are formed within the same outermost resin insulation layer 21. On the contrary, in the multilayered wiring substrate 10A according to the present embodiment, the motherboard connecting terminal 45 and the via conductor 34 are formed in different resin insulation layers 20 and 21. In addition, other configurations (including the connecting terminals 41 and 42, the conductor layer 26, and the resin insulation layers 22 to 24) in the multilayered wiring substrate 10A are the same as those of the first embodiment.

In the present embodiment, in the lower surface 32 side of the wiring stack portion 30A, the thickness L1 extending from the outer main surface 20a of the exposed outermost resin insulation layer 20 to the nearest conductor layer 26 corresponds to the sum of the thicknesses of the resin insulation layers 20 and 21. Therefore, the thickness L1 extending from the outer main surface 20a of the exposed outermost resin insulation layer 20 to the nearest conductor layer 26 is larger than each thickness L2 of the other resin insulation layers 22 to 24.

The multilayered wiring substrate 10A according to the present embodiment is manufactured in the following sequence.

Figure 17:
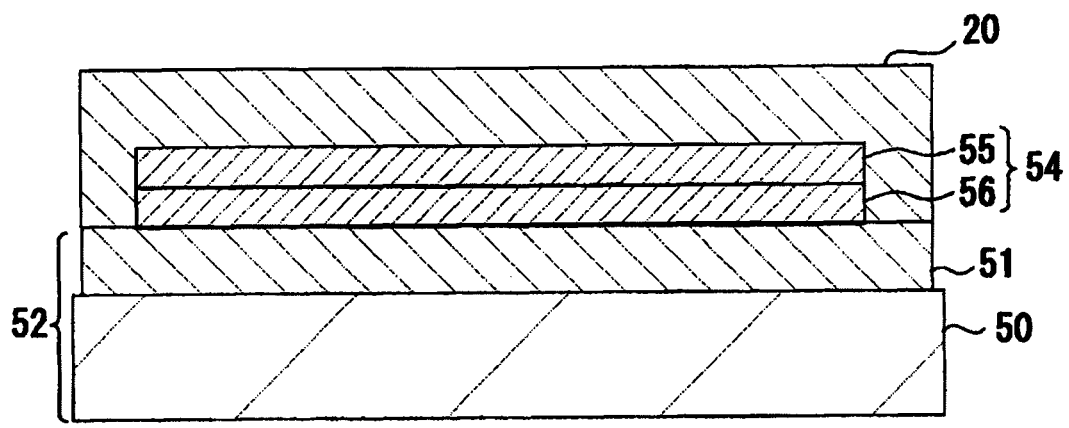
FIG. 17 is an explanatory diagram illustrating a method of manufacturing the multilayered wiring substrate.

First, the stack metal sheet body 54 is arranged on a single surface of the base material 52 (on the upper surface of the underlying resin insulation layer 51). Then, as shown in FIG. 17, the resin insulation layer 20 having a sheet shape is arranged to envelop the stack metal sheet body 54, and the resin insulation layer 20 is adhered. Here, the resin insulation layer 20 abuts on the stack metal sheet body 54 and at the same time, abuts on the underlying resin insulation layer 51 in the peripheral area of the stack metal sheet body 54 so as to seal the stack metal sheet body 54.

Figure 18:
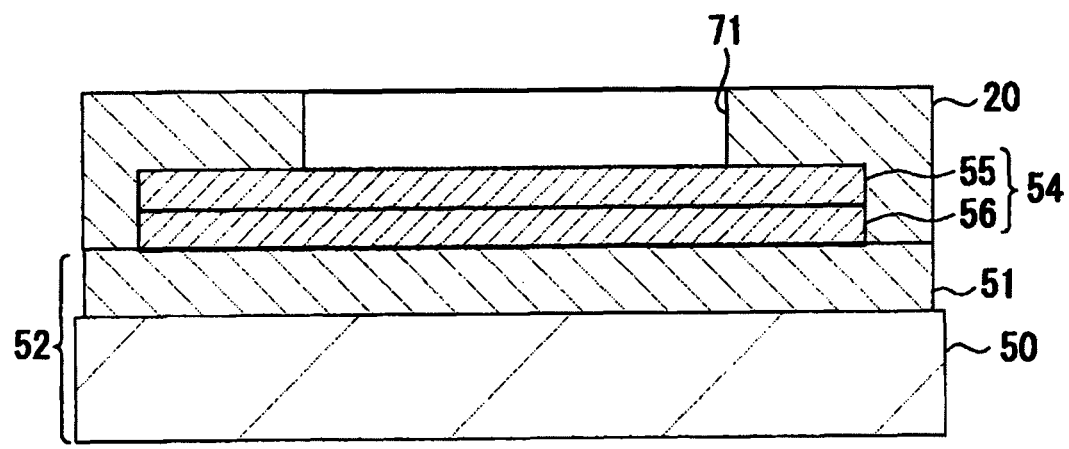
FIG. 18 is an explanatory diagram illustrating a method of manufacturing the multilayered wiring substrate.
Figure 19:
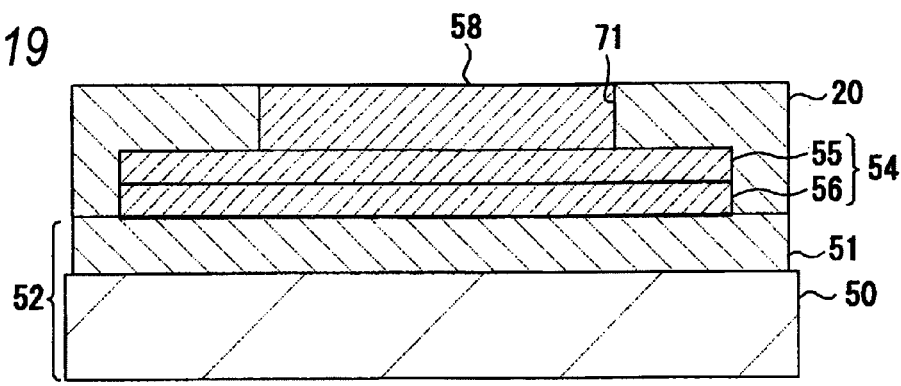
FIG. 19 is an explanatory diagram illustrating a method of manufacturing the multilayered wiring substrate.

Therefore, the metal conductor portion 58 corresponding to the motherboard connecting terminal 45 is formed on the stack metal sheet body 54 (a process of forming the metal conductor portion). Specifically, openings 71 having a predetermined pattern corresponding to the motherboard connecting terminal 45 are formed in the resin insulation layer 20 by performing a laser process, for example, using excimer laser, UV laser, or the like (refer to FIG. 18). Then, electro copper plating is performed, and the metal conductor portion 58 is formed on the stack metal sheet body 54 (refer to FIG. 19).

Figure 20:
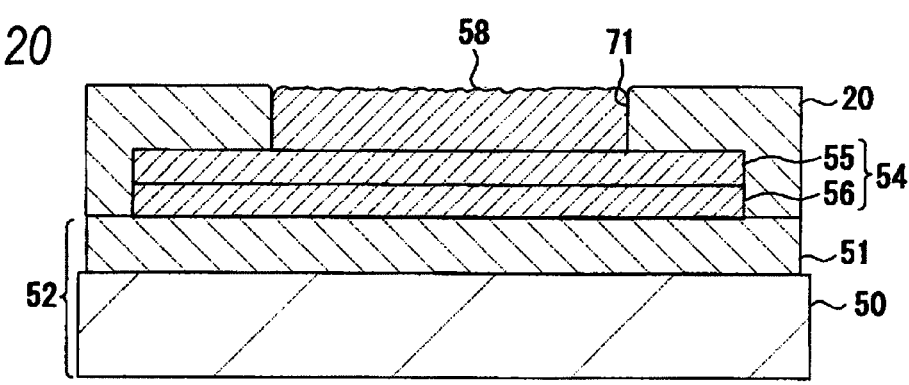
FIG. 20 is an explanatory diagram illustrating a method of manufacturing the multilayered wiring substrate.

After the process of forming the metal conductor portion, in order to improve adherence to the resin insulation layer, roughening (CZ treatment) is performed for the surface of the metal conductor portion 58 (refer to FIG. 20). In this case, the surface of the metal conductor portion 58 is roughened, and at the same time, the edge of the metal conductor portion 58 is rounded (a rounding process).

Figure 21:
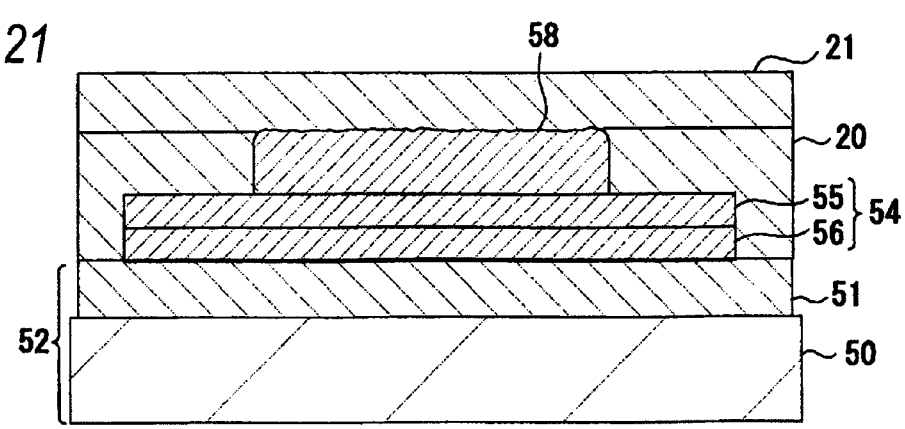
FIG. 21 is an explanatory diagram illustrating a method of manufacturing the multilayered wiring substrate.

Then, the resin insulation layer 21 having a sheet shape is arranged on the upper surface of the resin insulation layer 20 having the metal conductor portion 58, and the resin insulation layer 21 is adhered (refer to FIG. 21).

Figure 22:
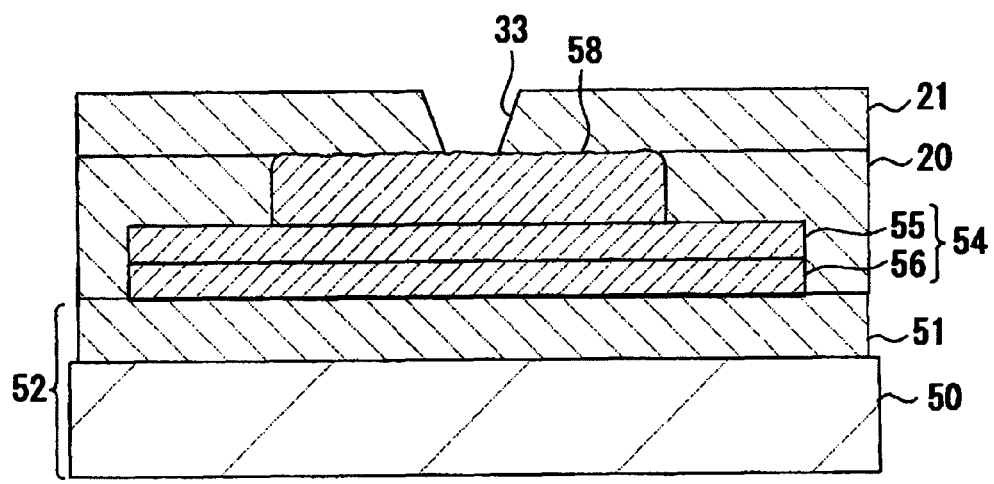
FIG. 22 is an explanatory diagram illustrating a method of manufacturing the multilayered wiring substrate.

In addition, as shown in FIG. 22, a via hole 33 is formed in a predetermined position (over the metal conductor portion 58) of the resin insulation layer 21 by performing a laser process, for example, using excimer laser, UV laser, or the like. Next, a de-smear process for removing the smear within each via hole 33 is performed using an etching solution such as a potassium permanganate solution.

Figure 23:
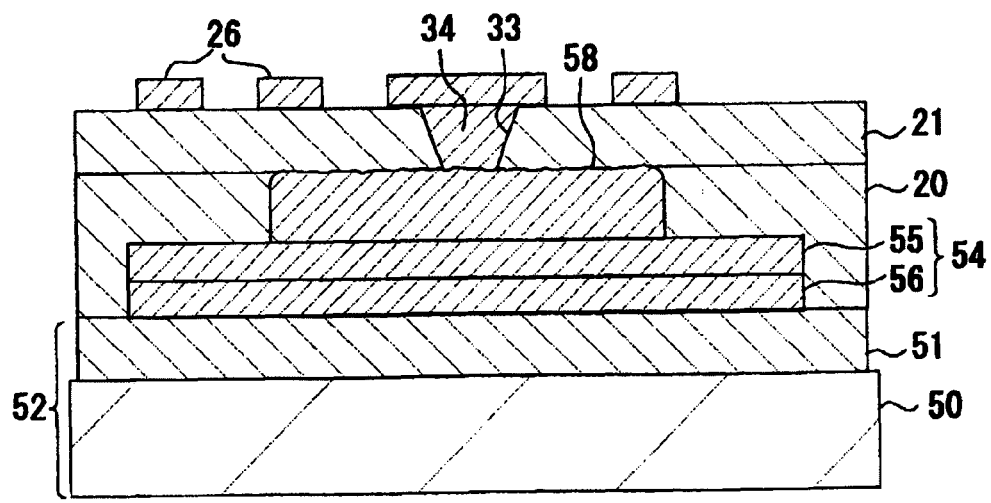
FIG. 23 is an explanatory diagram illustrating a method of manufacturing the multilayered wiring substrate.

After the de-smear process, a via conductor 34 is formed within each via hole 33 by performing electroless copper plating and electro copper plating according to a technique known in the related art. Furthermore, the conductor layer 26 is patterned on the resin insulation layer 21 by performing etching according to a technique known in the related art, e.g., a semi-additive method (refer to FIG. 23).

Figure 24:
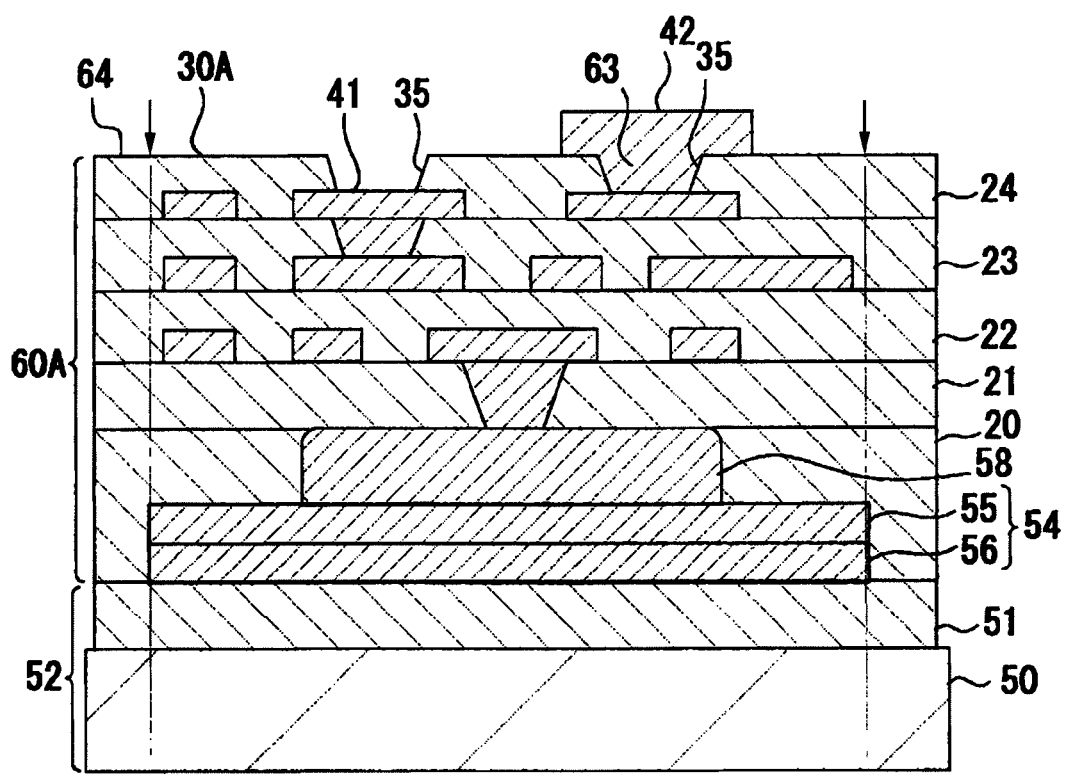
FIG. 24 is an explanatory diagram illustrating a method of manufacturing the multilayered wiring substrate.

In addition, the resin insulation layers 22 to 24 and the conductor layer 26 may be formed through the same technique as those of the aforementioned resin insulation layer 21 and the conductor layer 26, and may be stacked on the resin insulation layer 21. In addition, similar to the first embodiment, a plurality of openings 35 are formed by performing a laser boring process for the outermost resin insulation layer 24, and then, IC chip connecting terminal 41 or the condenser connecting terminal 42 is formed on the upper surface of the wiring stack body 60A by performing an entire surface plating process, a process of forming the filled via conductor, a process of removing the entire surface plating layer, or the like (refer to FIG. 24).

Figure 25:
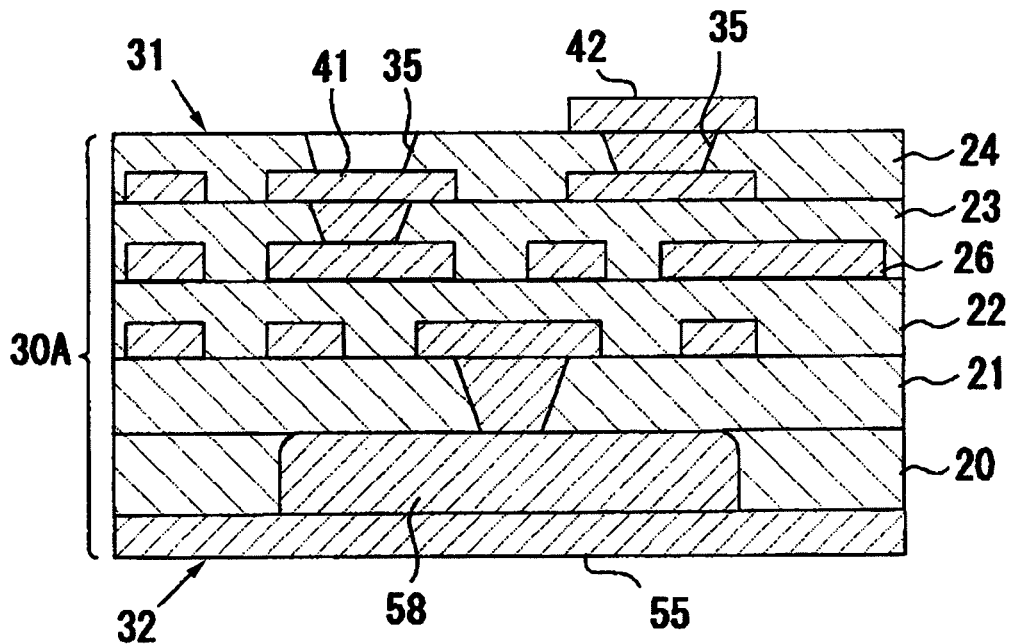
FIG. 25 is an explanatory diagram illustrating a method of manufacturing the multilayered wiring substrate.

After the process of removing the entire surface plating layer, the peripheral area 64 of the wiring stack portion 30A is removed by cutting the wiring stack body 60A using a dicing apparatus (not shown), that is a cutting process. In addition, the base material 52 is removed from the wiring stack portion 30A as shown in FIG. 25, and the copper foil 55 provided on the lower surface 32 of the wiring stack portion 30A (resin insulation layer 20) is exposed by performing a process of removing the base material and performing exfoliation at the interface between a pair of copper foils 55 and 56 in the stack metal sheet body 54.

Figure 26:
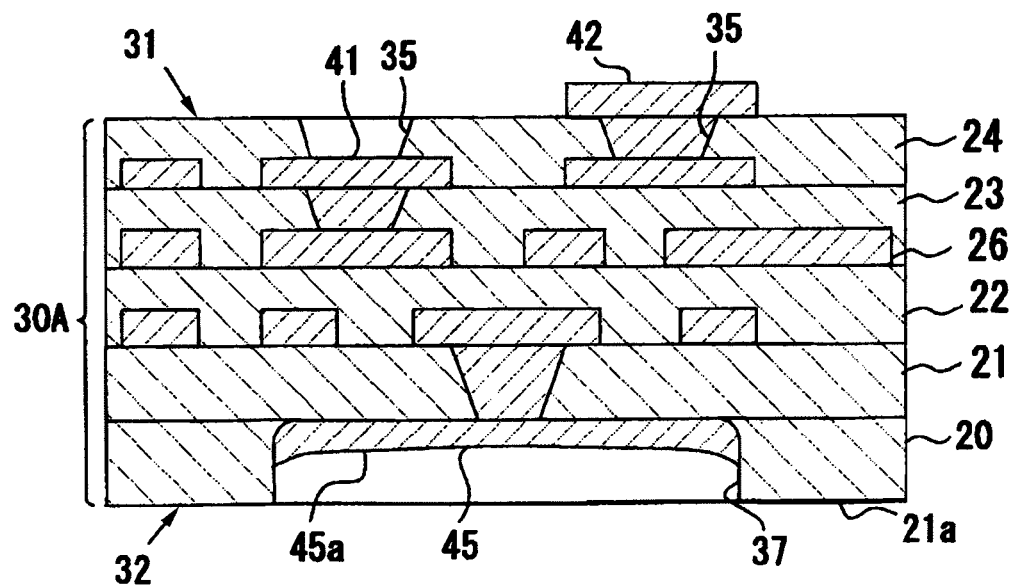
FIG. 26 is an explanatory diagram illustrating a method of manufacturing the multilayered wiring substrate.

Then, the motherboard connecting terminal 45 is formed by etching and removing the copper foil 55 except for a part of the metal conductor portion 58 in the lower surface 32 side of the wiring stack portion 30 (refer to FIG. 26). In addition, nickel-gold plating layers 46, 47, and 48 are formed by sequentially performing electroless nickel plating and electroless gold plating for the surface of the IC chip connecting terminal 41, the surface of the condenser connecting terminal 42, and the surface of the motherboard connecting terminal 45 (a plating process). Through the aforementioned processes, the multilayered wiring substrate 10A of FIG. 16 is manufactured.

Even in the multilayered wiring substrate 10A according to the present embodiment, the same effects as those of the first embodiment can be obtained.

In addition, each embodiment of the present invention may be modified as follows.

Figure 27:
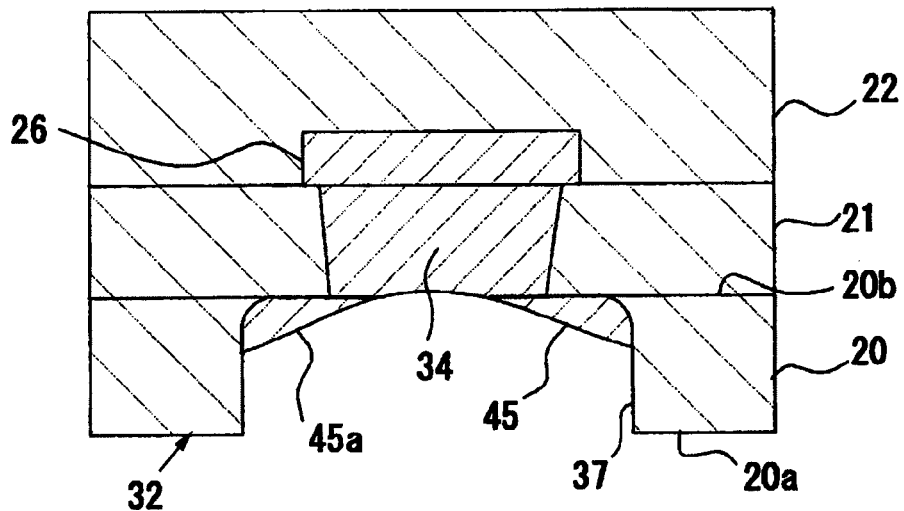
FIG. 27 is an enlarged cross-sectional view illustrating a motherboard connecting terminal according to another embodiment.

In the second embodiment described above, the terminal outer surface 45a having a concave shape in the motherboard connecting terminal 45 is not limited to a configuration that the deepest portion is positioned in an outer side from the inner main surface 20b of the outermost resin insulation layer 20. As shown in FIG. 27, the motherboard connecting terminal 45 may be formed such that the deepest portion of the terminal outer surface 45a is positioned in the inner side from the inner side main surface 20b of the outermost resin insulation layer 20 by deepening the deepest portion of the terminal outer surface 45a. If the motherboard connecting terminal 45 is formed in this manner, since the contact area of the solder in the terminal outer surface 45a increases, it is possible to sufficiently increase the connecting strength of the solder.

Figure 28:
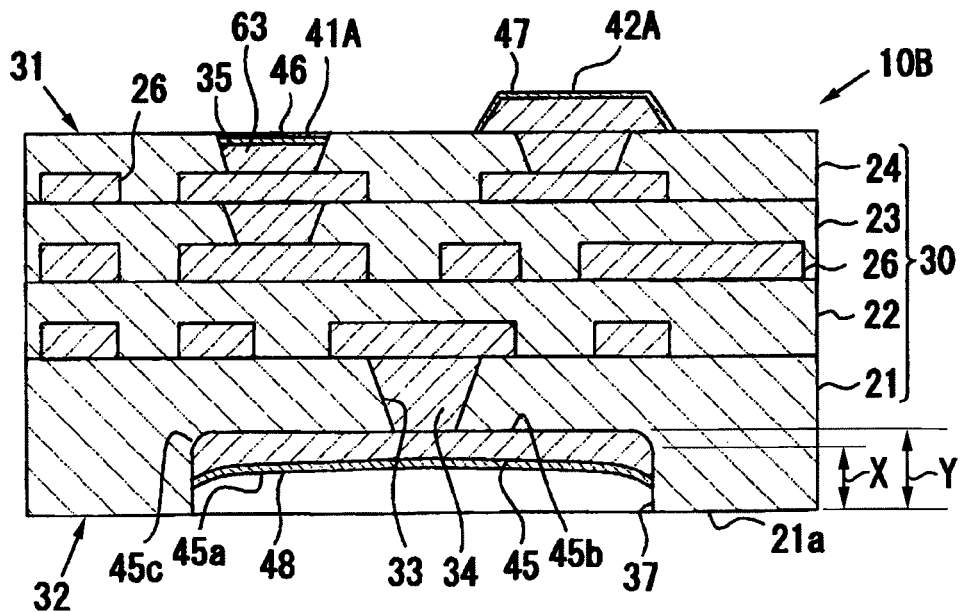
FIG. 28 is a cross-sectional view illustrating a schematic configuration of the multilayered wiring substrate according to another embodiment.
Figure 29:
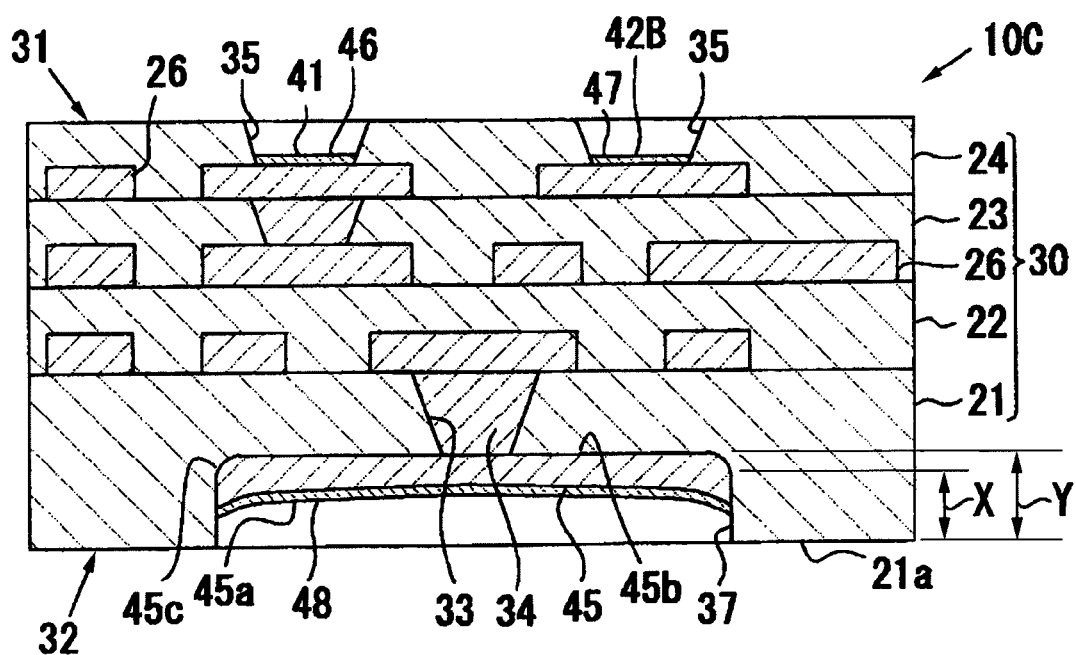
FIG. 29 is a cross-sectional view illustrating a schematic configuration of the multilayered wiring substrate according to another embodiment.
Figure 30:
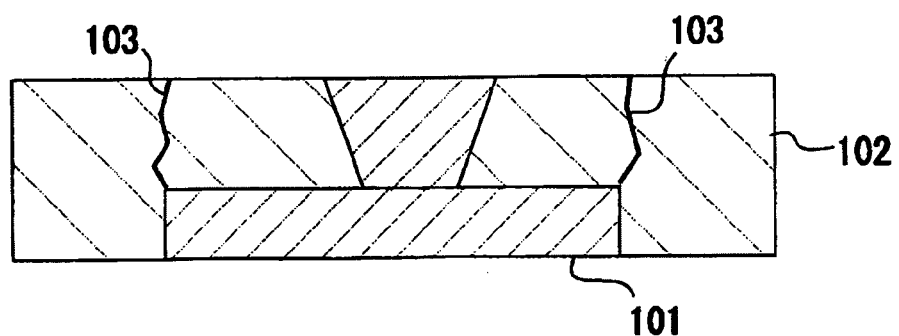
FIG. 30 is an enlarged cross-sectional view illustrating a multilayered wiring substrate of the related art.

In the multilayered wiring substrates 10 and 10A of each embodiment described above, while the condenser connecting terminal 42 formed on the upper surface 31 side is patterned using a semi-additive method, it may be patterned using a subtractive method. In this case, similar to the multilayered wiring substrate 10B shown in FIG. 28, the condenser connecting terminal 42A is formed to have a trapezoidal shape in which the area of the lower surface is larger than the area of the upper surface. In this manner, since the contact area between the condenser connecting terminal 42A and the resin insulation layer 24 increases, it is possible to obtain a sufficient connecting strength. In addition, as in the multilayered wiring substrate 10B, the IC chip connecting terminal 41A may be formed using a filled via conductor 63 obtained by filling the inner side of the opening 35. Furthermore, as in the multilayered wiring substrate 10C shown in FIG. 29, similar to the IC chip connecting terminal 41, the condenser connecting terminal 42B may be formed to be exposed within the opening 35. Moreover, the condenser connecting terminal 42B has nearly the same height as that of the IC chip connecting terminal 41.

While the terminal outer surface 45a of the motherboard connecting terminal 45 has a concave shape by etching in each of the aforementioned embodiments, the present invention is not limited thereto. For example, the terminal outer surface 45a having a concave shape may be formed using a laser process or the like. In addition, the terminal outer surface 45a having a concave shape may be formed by performing a plurality of etching processes. Specifically, after a concave portion smaller than the motherboard connecting terminal 45 is formed through the first etching, the terminal outer surface 45a having a concave shape may be formed by sequentially performing the second etching.

While a plurality of conductor layers 26 formed in a plurality of resin insulation layers 21 to 24 are connected to each other through a via conductor 34 tapered such that a diameter is widened from the lower surface 32 side to the upper surface 31 side in each of the embodiments described above, the present invention is not limited thereto. The via conductors 34 formed in a plurality of resin insulation layers 21 to 24 may be tapered in the same direction, and a plurality of conductor layers 26 may be connected to each other through a via conductor tapered such that a diameter is widened from the upper surface 31 side to the lower surface 32 side.

While the plating layers 46, 47, and 48 covering the connecting terminals 41, 42, and 45, respectively, are made of a nickel-gold plating layer in each of the embodiments described above, plating layers other than copper may be used. For example, other plating layers such as a nickel-palladium-gold plating layer may be used.

Next, a technical concept as understood through each embodiment described above will be described below.

(1) There is provided a multilayered wiring substrate having a stack structure multilayered by alternately stacking a plurality of conductor layers and a plurality of resin insulation layers including an identical resin insulation material, a plurality of first main surface side connecting terminals being arranged in a first main surface side of the stack structure, a plurality of second main surface side connecting terminals being arranged in a second main surface side of the stack structure, a plurality of the conductor layers being formed in a plurality of the resin insulation layers and connected to each other through a via conductor tapered such that a diameter is widened toward the first main surface side or the second main surface side, wherein a plurality of openings are formed in an exposed outermost resin insulation layer in the second main surface side of the stack structure, terminal outer surfaces of the second main surface side connecting terminals arranged to match with a plurality of the openings are positioned inwardly from an outer main surface of the outermost resin insulation layer, edges of terminal inner surfaces are rounded, at least two types of first main surface side connecting terminals having different connection targets exist in the first main surface side, and the height of the upper surface of the first main surface side connecting terminal is differently set depending on the type of the connection target.

(2) There is provided a method of manufacturing a multilayered wiring substrate having a stack structure multilayered by alternately stacking a plurality of conductor layers and a plurality of resin insulation layers including an identical resin insulation material, a plurality of first main surface side connecting terminals being arranged in a first main surface side of the stack structure, a plurality of second main surface side connecting terminals being arranged in a second main surface side of the stack structure, a plurality of the conductor layers being formed in a plurality of the resin insulation layers and connected to each other through a via conductor tapered such that a diameter is widened toward the first main surface side or the second main surface side, the method including: a process of forming a metal conductor portion, including preparing a support base material made by stacking metal foils on a single surface in a removable state and forming a metal conductor portion to be used as the second main surface side connecting terminal later on the metal foil; a rounding process for rounding the edge of the metal conductor portion after the process of forming the metal conductor portion; a build-up process for forming a stack structure multilayered by alternately stacking a plurality of resin insulation layers and a plurality of conductor layers after the rounding process; a process of removing the base material, in which the metal foil is exposed by removing the support base material after the build-up process; and a process of forming the connecting terminals, in which the second main surface side connecting terminals are formed by etching and removing the metal foil in the stack structure except for a part of the metal conductor portion after the build-up process.

What is claimed is:

1. A multilayered wiring substrate, comprising:
a stack structure multilayered by alternately stacking a plurality of conductor layers and a plurality of resin insulation layers including an identical resin insulation material;
a plurality of first-main-surface-side connecting terminals arranged in a first main surface of the stack structure; and
a plurality of second-main-surface-side connecting terminals arranged in a second main surface of the stack structure;
wherein
the plurality of conductor layers are formed in the plurality of resin insulation layers and are operably connected to each other through via conductors tapered such that diameters thereof are widened toward the first main surface or the second main surface,
wherein
a plurality of openings are formed in an exposed outermost resin insulation layer in the second main surface of the stack structure, and
terminal outer surfaces of the second-main-surface-side connecting terminals arranged to match with the plurality of the openings are positioned inwardly from an outer main surface of the exposed outermost resin insulation layer and edges of terminal inner surfaces are rounded.

2. The multilayered wiring substrate according to claim 1, wherein the terminal outer surfaces of the plurality of the second-main-surface-side connecting terminals arranged to match with the plurality of openings have a concave shape.

3. The multilayered wiring substrate according to claim 1, wherein
the terminal outer surfaces of the plurality of the second-main-surface-side connecting terminals arranged to match with the plurality of the openings have a concave shape, and a deepest portion of the terminal outer surface is positioned inwardly from an inner main surface of the outermost resin insulation layer.

4. The multilayered wiring substrate according to claim 1, wherein, in the second main surface of the stack structure, the outer main surface of the exposed outermost resin insulation layer is defined as a reference surface, and a length (X) extending from the outer main surface to an end portion of each terminal inner surface is shorter than a length (Y) extending from the outer main surface to a center portion of each terminal inner surface.

5. The multilayered wiring substrate according to claim 1, wherein, in the second main surface of the stack structure, when the outer main surface of the exposed outermost resin insulation layer is used as a reference surface, a length extending from the outer main surface to each terminal inner surface is gradually shortened as running from a center portion of each terminal inner surface to an end portion thereof.

6. The multilayered wiring substrate according to claim 1, wherein
the plurality of the second-main-surface-side connecting terminals arranged to match with the plurality of the openings are to be connected to a motherboard and correspond to a plurality of motherboard connecting terminals, each of the plurality of motherboard connecting terminals having an area larger than that of each first-main-surface-side connecting terminal.

7. The multilayered wiring substrate according to claim 1, wherein, with respect to the second main surface of the stack structure, a thickness of the exposed outermost resin insulation layer is larger than each thickness of the other resin insulation layers in the stack structure.

8. The multilayered wiring substrate according to claim 1, wherein all of the via conductors formed in the plurality of resin insulation layers are tapered such that the diameters thereof are widened as running from the second main surface to the first main surface.

9. A multilayered wiring substrate comprising:
a stack structure multilayered by alternately stacking a plurality of conductor layers and a plurality of resin insulation layers including an identical resin insulation material;
a plurality of first-main-surface-side connecting terminals arranged in a first main surface of the stack structure;
a plurality of second-main-surface-side connecting terminals arranged in a second main surface of the stack structure;
wherein
the plurality of conductor layers are formed in the plurality of resin insulation layers and are operably connected to each other through via conductors tapered such that diameters thereof are widened toward the first main surface or the second main surface,
wherein
a plurality of openings are formed in an exposed outermost resin insulation layer in the second main surface of the stack structure,
terminal outer surfaces of the second-main-surface-side connecting terminals arranged to match with the plurality of the openings are positioned inwardly from an outer main surface of the exposed outermost resin insulation layer, and
in the second main surface of the stack structure, the outer main surface of the exposed outermost resin insulation layer is defined as a reference surface, and a length extending from the outer main surface to each terminal inner surface is gradually shortened as running from a center portion of each terminal inner surface to an end portion thereof.

10. The multilayered wiring substrate according to claim 9, wherein
the terminal outer surfaces of the plurality of the second-main-surface-side connecting terminals arranged to match with the plurality of the openings have a concave shape.

11. The multilayered wiring substrate according to claim 9, wherein
the terminal outer surfaces of the plurality of the second-main-surface-side connecting terminals arranged to match with the plurality of the openings have a concave shape, and a deepest portion of the terminal outer surface is positioned inwardly from an inner main surface of the outermost resin insulation layer.

12. The multilayered wiring substrate according to claim 9, wherein
the plurality of the second-main-surface-side connecting terminals arranged to match with the plurality of the openings are to be connected to a motherboard and correspond to a plurality of motherboard connecting terminals having an area larger than that of the first-main-surface-side connecting terminal.

13. The multilayered wiring substrate according to claim 9, wherein, in the second main surface of the stack structure, a thickness of the exposed outermost resin insulation layer is larger than each thickness of other resin insulation layers in the stack structure.

14. The multilayered wiring substrate according to claim 9, wherein all of the via conductors formed in the plurality of resin insulation layers are tapered such that the diameters thereof are widened as running from the second main surface to the first main surface.

15. A multilayered wiring substrate, comprising:
a stack structure multilayered by alternately stacking a plurality of conductor layers and a plurality of resin insulation layers including an identical resin insulation material;
a plurality of first-main-surface-side connecting terminals arranged in a first main surface of the stack structure; and
a plurality of second-main-surface-side connecting terminals arranged in a second main surface of the stack structure;
wherein
the plurality of conductor layers are formed in the plurality of resin insulation layers and are operably connected to each other through via conductors tapered such that diameters thereof are widened toward the first main surface or the second main surface,
wherein
a plurality of openings are formed in an exposed outermost resin insulation layer in the second main surface of the stack structure,
terminal outer surfaces of the second-main-surface-side connecting terminals arranged to match with the plurality of the openings are positioned inwardly from an outer main surface of the exposed outermost resin insulation layer and edges of terminal inner surfaces are rounded, and
wherein
terminal side surfaces of each of the second-main-surface-side connecting terminals are formed continuously from the terminal inner surfaces to the terminal outer surfaces.

* * * * *